United States Patent
Speier

(10) Patent No.: US 9,146,291 B2
(45) Date of Patent: Sep. 29, 2015

(54) METHOD TO GENERATE AN MR IMAGE, AND CORRESPONDING MAGNETIC RESONANCE SYSTEM

(71) Applicant: Peter Speier, Erlangen (DE)

(72) Inventor: Peter Speier, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 516 days.

(21) Appl. No.: 13/667,105

(22) Filed: Nov. 2, 2012

(65) Prior Publication Data

US 2013/0113482 A1      May 9, 2013

(30) Foreign Application Priority Data

Nov. 4, 2011   (DE) .................... 10 2011 085 766

(51) Int. Cl.
 *G01V 3/00*   (2006.01)
 *G01R 33/48*  (2006.01)
(52) U.S. Cl.
 CPC ........ *G01R 33/4818* (2013.01); *G01R 33/4824* (2013.01)
(58) Field of Classification Search
 CPC .................. G01R 33/4818; G01R 33/4824
 USPC ............................................... 324/309
 See application file for complete search history.

(56) References Cited

U.S. PATENT DOCUMENTS

| | | | | |
|---|---|---|---|---|
| 7,046,004 | B2* | 5/2006 | Bieri et al. | 324/307 |
| 7,999,543 | B2* | 8/2011 | Dahnke et al. | 324/309 |
| 2005/0258829 | A1 | 11/2005 | Bieri et al. | |
| 2006/0079754 | A1 | 4/2006 | Welch et al. | |
| 2007/0106150 | A1* | 5/2007 | Greiser et al. | 600/413 |
| 2007/0242866 | A1* | 10/2007 | Schmitt et al. | 382/130 |
| 2012/0313640 | A1* | 12/2012 | Pfeuffer | 324/309 |
| 2013/0154641 | A1* | 6/2013 | Grodzki | 324/309 |
| 2015/0035531 | A1* | 2/2015 | Stemmer | 324/309 |

OTHER PUBLICATIONS

Theilmann et al., "View-Ordering in Radial Fast Spin-Echo Imaging," Magnetic Resonance in Medicine, vol. 51 (2004), pp. 768-774.
Song et al., "Dynamic MRI With Projection Reconstruction and KWIC Processing for Simultaneous High Spatial and Temporal Resolution," Magnetic Resonance in Medicine, vol. 52 (2004), pp. 815-824.

(Continued)

*Primary Examiner* — Rodney Fuller
(74) *Attorney, Agent, or Firm* — Schiff Hardin LLP

(57) ABSTRACT

To generate an MR image, acquired MR data are entered into k-space on multiple uniform trajectories in k-space within a predetermined time period. The trajectories are acquired chronologically in a predetermined order before a predetermined point in time, and in a different order after the point in time. The i-th trajectory after the point in time in the different order is adjacent to the (n−i+1)-th trajectory in the predetermined order (n is the number of trajectories acquired before and after the point in time). Two trajectories are adjacent if a distance between them is less than a predetermined threshold. Except for the (n−i+1)-th trajectory, none of the trajectories acquired before the point in time has a distance from the i-th trajectory that is less than the threshold. The predetermined time period is set to be at a middle of a time period after an RF excitation pulse, such that a contrast change within the predetermined time period proceeds as linearly as possible over time.

15 Claims, 9 Drawing Sheets

(56) References Cited

OTHER PUBLICATIONS

Doneva et al., "Compressed Sensing Reconstruction for Magnetic Resonance Parameter Mapping," Magnetic Resonance in Medicine, vol. 64 (2010), pp. 1114-1120.

"Modellbasierte Rekonstruktion unterabgetasteter radialer Daten am Beispiel der Herzperfusion," Jakob, Dissertation Thesis at University of Wurzburg (2010).

* cited by examiner

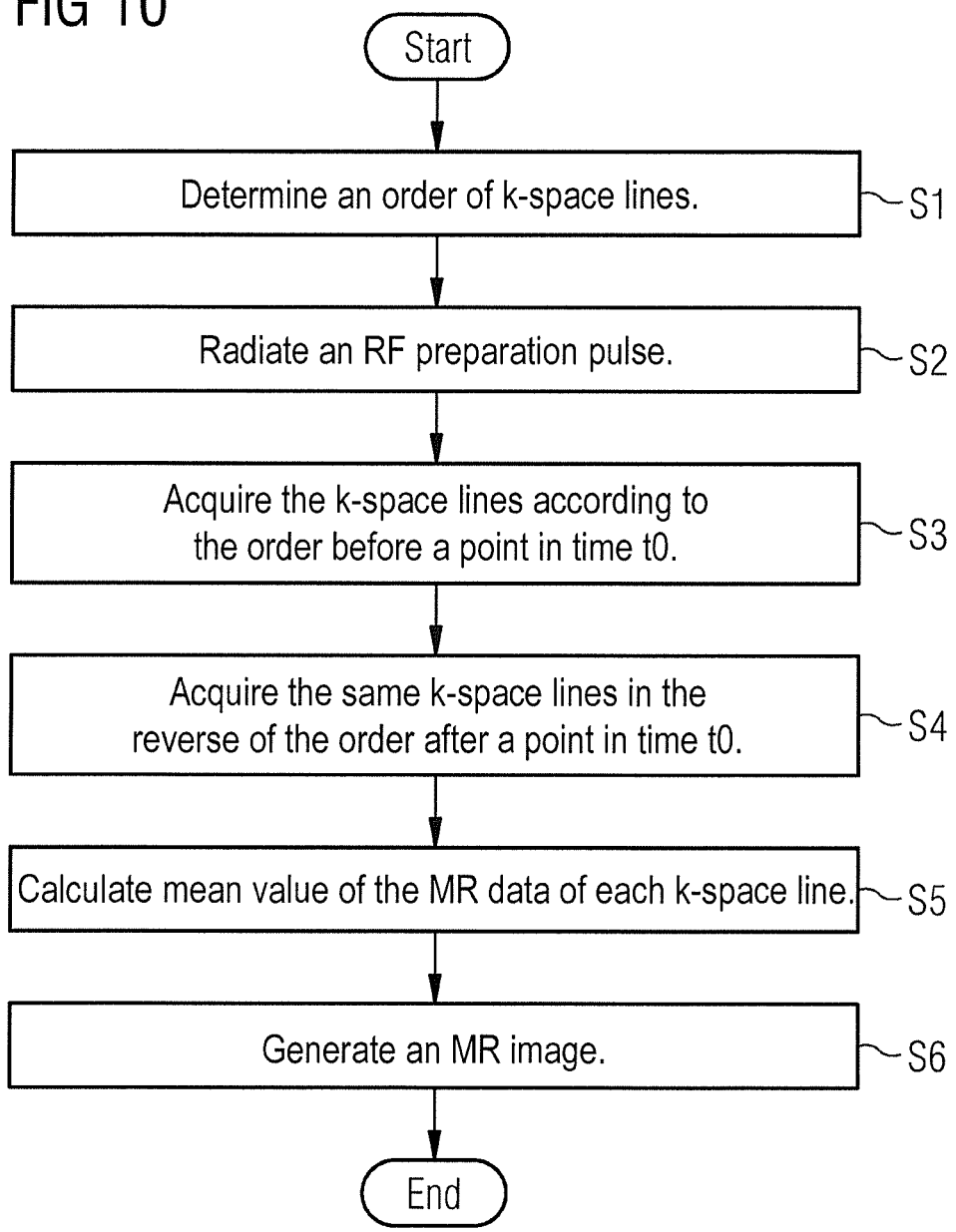

METHOD TO GENERATE AN MR IMAGE, AND CORRESPONDING MAGNETIC RESONANCE SYSTEM

BACKGROUND OF THE INVENTION

1. Field of the Invention

The present invention concerns a method to generate an MR image based on an MR measurement (data acquisition) with a magnetic resonance system, and a correspondingly designed magnetic resonance system.

2. Description of the Prior Art

For fast generation of MR images weighted with regard to contrast, according to the prior art a contrast that is as optimal as possible is first provided by means of defined preparation modules such as IR ("Inversion Recovery"), SR ("Saturation Recovery"), T2prep (T2 preparation sequence). The signal is subsequently read out within an expanded acquisition window with the use of an SSFP ("Steady State Free Precession") sequence, while the contrast decays to a contrast that prevails given the free precession in the rest state. Contrast changes during the MR data acquisition in k-space disadvantageously lead to artifacts in the resulting MR images. The contrast is determined by the contrast that is present at the point in time at which the middle of k-space is scanned (i.e. pre-determined data points (locations) in k-space are filled with respective measured data values).

Methods for MR data acquisition that scan (enter data into) the middle of k-space multiple times, such as radial methods, segmented spiral-shaped methods or a method known as PROPELLER ("Periodically Rotated Overlapping ParallEL Lines with Enhanced Reconstruction"), lead to an excellent signal-to-noise ratio and have other advantages, for example an insensitivity to movement of the examination subject or an accelerated parallel (operating with multiple reception coils) data acquisition. However, in the case of fast generation of MR images weighted with respect to a contrast, these methods disadvantageously have an undefined contrast that results as a mean value over the acquisition window.

SUMMARY OF THE INVENTION

An object of the present invention is to provide a fast image creation with regard to contrast of weighted MR images, wherein no undefined contrast occurs, and wherein all acquired MR data are used for MR image reconstruction, which is implemented sufficiently quickly.

In accordance with the present invention, in a method to create an MR image based on an MR measurement with a magnetic resonance system, MR data are provided in k-space that corresponds with a volume segment for which the MR image is to be created. The method according to the invention includes the following steps:

Switch (activate) at least one RF excitation pulse or one RF preparation module.

Switch additional RF pulses (refocusing pulses, for example) and at least one magnetic field gradient in order to acquire the MR data on or along multiple uniform trajectories or, lines in k-space within a predetermined time period. The MR data are acquired in that these MR data are acquired for points along or on a trajectory or line in k-space. Uniform trajectories or lines are trajectories or lines within k-space that have the same shape and the same dimensions. For example, all lines can have a straight line or spiral shape or a different shape, as long as they are congruent. In other words, the lines differ only with regard to the position in k-space. The acquisition of one or the lines comprises a readout of MR data long this line.

The MR image is reconstructed depending on the MR data acquired on the lines.

For MR data acquisition, the lines are acquired in a predetermined order before a predetermined point in time within the time period, and in a predetermined order after a predetermined point in time within the time period. "Acquiring" a line of k-space means filling all of the data points thereof, that are intended to be filled, with respective entries of measured data values The lines acquired before the point in time are synchronized with the lines acquired after the point in time such that the i-th line after the point in time (in the other order) lies adjacent to the (n−i+1)-th line in the predetermined order. Both the predetermined order and the other order begin with a 1st line (there is no 0th line), and n lines exist both before and after the point in time.

Two lines are considered to be adjacent if a spatial distance in k-space between the two lines is less than a predetermined threshold. The lines are scanned synchronously such that, except for the (n−i+1)-th line, none of those lines which are acquired before the point in time has a distance from the i-th line that is less than the threshold. Expressed in a different way, no line scanned before the point in time lies closer to the i-th line scanned after the point in time than the (n−i+1)-th line in the predetermined order.

The predetermined time period lies within a time duration which begins after the switching of the RF excitation pulse such that a contrast change within the predetermined time period proceeds as linearly as possible over time. The predetermined point in time is thereby situated centrally within this time period so that half of the time period extends before the point in time and the other half of the time period lies after the point in time.

In other words, a line which is scanned at a time interval after the point in time lies adjacent to that line which is scanned at the time interval before the point in time. Since the contrast changes linearly with time during the time period, the mean value from the contrast that is detected at the time interval after the point in time and the contrast that is detected at the time interval before the point in time corresponds to the contrast which is detected at the predetermined point in time (when the two lines are identical).

Because according to the invention the contrast change proceeds essentially linearly over time during the time period, and since, the lines to be detected during the time period are detected by means of the two predefined orders, nearly artifact-free MR images can be created that have valid contrast at the point in time.

It is noted that, according to the invention, it is possible to additionally scan another k-space line at the predetermined point in time. Since, by definition, this k-space line is scanned neither before nor after the predetermined point in time, it belongs neither to the lines scanned before the point in time nor to the lines scanned after the point in time.

The goal of the present invention—to create fast MR images which are weighted with regard to their contrast—is accordingly achieved by the following features:

The acquisition window or the acquisition time is limited to a duration during which the contrast change proceeds essentially linearly in the tissue to be acquired. The acquisition time or, respectively, time period can be determined by preliminary measurements at the volume segment to be examined. The contrast curve over time is detected by the preliminary measurement, and the time period or acquisition time is subsequently set such that the contrast change in the tissue to be acquired proceeds essentially linearly during the time period.

The k-space lines to be scanned are sorted such that sample points in time of pairs of these k-space lines are situated symmetrically relative to the point in time. Each pair of a k-space line to be acquired before and after the point in time is thereby formed, with these two k-space lines being spatially arranged adjacent to one another.

Those two lines that form a pair due to their neighboring relationship, or that are adjacent according to the aforementioned definition (separation in k-space is less than the predetermined threshold), have a temporal symmetry relative to the predetermined point in time. This temporal symmetry is characterized by one of the two lines being scanned at the same time interval before the predetermined point in time as the other of the two lines is scanned at the same time interval after the predetermined point in time. This temporal symmetry applies for all pairs.

According to a preferred embodiment of the invention, the spatial distance between two lines in k-space is defined as an angle interval by which one of the two lines is rotated relative to the other of the two lines around the center point of k-space (k-space center).

For example, this angle or angle interval can be determined by defining the same assigned point both for the one line and for the other line, with this assigned point not being the middle point of k-space. Since, by definition, the two lines are identical in shape, this point lies at the same position relative to the respective line. The angle interval is now defined between a first leg that extends from the point of the one line to the middle point of k-space, and a second leg that extends from the point of the other line to the middle point of k-space.

This angle interval $\beta$ preferably satisfies the following Inequality (1).

$$\beta \leq \frac{360°}{2*n}. \tag{1}$$

wherein n is the number of lines that are scanned before the defined point in time.

The Inequality (1) above assumes that an angle interval is constant between the lines which are scanned before the point in time. Expressed differently, the above Inequality (1) assumes that every line that is scanned before the point in time has a defined angle interval to its nearest neighboring line. This defined angle interval is the same for all lines that are scanned before the point in time. A line can have multiple (for example two) neighboring lines that then respectively have the defined angle interval to that line.

The lines to be acquired within the predetermined time period preferably lie in one plane.

According to the invention, the lines to be acquired can be distributed either in three-dimensional k-space, or limited only to a two-dimensional plane of k-space.

According to a preferred embodiment of the invention, an angle $\alpha$ exists by which the (i+1)-th line is rotated relative to the i-th line in the predetermined order around the k-space center (middle point of k-space). In this embodiment, the lines to be acquired lie in one plane. The predetermined order is accordingly defined using this angle $\alpha$ so that each line is rotated by this angle $\alpha$ relative to its direct predecessor line.

Since, according to the invention, the i-th line after the point in time in the other order lies adjacent to the (n−i+1)-th line according to the predetermined order (before the point in time), it is useful for the lines that are scanned after the predetermined point in time to have the angle $\alpha$ by which the (i+1)-th line is rotated relative to the i-th line in the other order around the k-space center (middle point of k-space).

The angle $\alpha$ has the following relation to the angle interval $\beta$:

$$\alpha \geq 2*\beta \tag{2}.$$

According to the inequality (2), every line which is scanned after the predetermined point in time has an angle interval relative to its partner line scanned before the predetermined point in time which at most corresponds to half of the angle that, according to this embodiment, this partner line has relative to its immediate predecessor line or successor line. According to the invention, the partner line is that line scanned after the point in time adjacent to which the line scanned before the point in time lies, according to the above definition. The (n−i+1)-th line in the predetermined order is accordingly the partner line of the i-th line in the other order.

According to the invention, it is likewise possible for the lines to be acquired in segments. This means that the lines within the predetermined time period are not scanned based on only one RF excitation pulse or RF preparation module, but instead multiple such RF excitation pulses or RF preparation modules with subsequent switching of additional RF pulses and magnetic field gradients are used in order to acquire the lines. The number of required RF excitation pulses or RF preparation modules corresponds to the number of segments. The number of segments can be even or odd, but an odd number is preferred.

According to a preferred embodiment of the invention, those lines that are scanned before the predetermined point in time given an unsegmented acquisition of the MR data are associated with a first set of segments. The lines that are acquired after the predetermined point in time given an unsegmented acquisition of the MR data are associated with a second (relative to the first) disjoint set of these lines. The first set and second set thereby respectively contain half of the segments. In the acquisition of the lines in segments, a rotation direction exists in which an acquired line is rotated around the k-space center by a first angle in order to generate the line immediately following the respective line. If the lines with multiple segments are acquired, this rotation direction is not changed in the acquisition of the lines of the same segment.

In the segmented acquisition of MR data, every time period in which the k-space lines of the respective segment are acquired corresponds to the predetermined time period. If all lines of all segments are sorted corresponding to that point in time at which the respective line is scanned relative to the predetermined point in time of the time period of its segment, according to the invention the lines can then be arranged in the predetermined order and in the other order. Expressed differently, each of these lines (except for the line(s) that is/are scanned at the predetermined point in time) can be associated with a pair so that this pair is situated symmetrical to the predetermined point in time, and such that—according to the invention—the two lines of the pair lie adjacent to one another.

An end point of each line to be acquired during the time period can correspond to the center of k-space.

In other words: according to this embodiment, each line ends or begins in the center of k-space.

According to an embodiment according to the invention, those lines which are acquired after the predetermined point in time are rotated by 180° around the k-space center before the respective line is acquired.

In other words: in this embodiment, a line to be acquired after the predetermined point in time is first mirrored on a point at the k-space center before it is actually acquired. This embodiment is accordingly possible both for lines situated in one plane and for lines distributed in three-dimensional space.

This embodiment is applicable both for lines that end in the k-space center and for lines that do not end in the k-space center. This embodiment applies both for lines that are symmetrical relative to the k-space center and for lines that are asymmetrical relative to the k-space center. This embodiment also covers the clinically interesting case of lines asymmetrical to the k-space center that do not end at said k-space center. It is noted that the readout direction in lines symmetrical to the k-space center is arbitrary for the contrast response, such that the readout direction in this case can be freely selected, for example depending on other requirements (for example the avoidance of eddy current effects).

In other words: in this embodiment, the symmetry for the respective pair of lines is established by one of these lines being rotated by 180° around the k-space center.

According to this embodiment, the definition according to the invention, that defines when two lines are adjacent, is modified such that two lines are adjacent when either a distance between the two lines is less than a predetermined threshold, or when a distance between the one line and the other line, rotated by 180°, lies below the predetermined threshold.

This embodiment reduces artifacts that occur during the readout of a line due to a signal attenuation or due to interferences lying on the trajectory.

According to a further embodiment of the invention, the other order corresponds to the reverse of the predetermined order, such that—according this embodiment—the same lines (or the same lines rotated by 180°) are acquired after the predetermined point in time as before the point in time. The line acquired first after the point in time accordingly corresponds to the last line acquired before the point in time.

Accordingly this embodiment, the distance between the line acquired after the point in time and its partner line is 0 (meaning that no separation exists since the lines coincide with one another) or, respectively, 0°.

Each line can travel a straight line in k-space to simplify the method according to the invention.

A mean value of MR data of the respective two adjacent lines or, respectively, of the line scanned after the point in time and its partner line scanned before the point in time is advantageously calculated in the generation of the MR image.

This mean value calculation can be generated, for example, for each scanned k-space point of the one line, by averaging the MR data of this k-space point with the MR data of the corresponding k-space point of the partner line.

In embodiments in which a distance exists between the lines of a pair, the results of the mean value calculation can be used as start values for an iterative reconstruction of the MR image. By MR data of the k-space lines being iteratively generated from the intermediate MR image created in each iteration loop, and compared with the measured MR data and corrected, the MR data (and not only the mean values) measured per k-space line can accordingly also contribute to the reconstruction of the MR image.

According to another embodiment of the invention, each line (with the exception of the first or last line according to the other order) which is acquired after the predetermined point in time lies in the middle between two lines adjacent in k-space which are acquired before the predetermined point in time. The first or last line according to the other order plays a special role since, among the lines acquired before the point in time, it is only its partner line from which the line in question has the shortest distance (all other lines have two lines from which they have the shortest distance).

According to this embodiment, each line scanned after the point in time has the same distance from its partner line scanned before the point in time. This distance corresponds to half of that separation exhibited by two lines that are arranged spatially next to one another before the point in time.

Within the scope of the present invention, a magnetic resonance system is also provided to generate an MR image based on an MR measurement in which the magnetic resonance system acquires MR data in k-space. The magnetic resonance system includes a basic field magnet, a gradient field system, one or more RF antennas, and a control device to control the gradient field system and the RF antenna(s), to receive the measurement signals acquired by the RF antenna(s), and to evaluate the measurement signals and to generate the MR image data sets. The magnetic resonance system excites the volume segment, to which k-space corresponds, with an RF excitation pulse and switches (activates) additional RF pulses and at least one magnetic field gradient in order to acquire the MR data along multiple uniform trajectories or lines in k-space within a predetermined time period. The magnetic resonance system generates the MR image depending on the MR data acquired in k-space. The magnetic resonance system thereby acquires the lines before a predetermined point in time that lies in the middle of the time period, chronologically in a predetermined order. The magnetic resonance system acquires the lines after the predetermined point in time in a different temporal order, such that the i-th line after the point in time according to other order lies adjacent to the $(n-1+1)$-th line of the predetermined order (before the point in time). The number n is the number of lines acquired before the point in time and the number of lines acquired after the point in time. According to the invention, two lines are adjacent when a distance between these two lines is less than a predetermined threshold. Except for the $(n-1+i)$-th line according to the predetermined order, none of the lines acquired before the point in time has a distance from the i-th line (according to the other order) that is shorter than the threshold. The magnetic resonance system determines the predetermined time period (in particular under consideration of specific user inputs) so that it is within a time interval after the switching of the RF excitation pulse that allows a contrast change to proceed optimally linearly over time within the predetermined time period.

The advantages of the magnetic resonance apparatus according to the invention essentially correspond to the advantages of the method according to the invention that have been described above.

The present invention also encompasses a non-transitory, computer-readable data storage medium encoded with programming instructions that, when the storage medium is loaded into a computerized control system of a magnetic resonance apparatus, cause the control system to operate the magnetic resonance apparatus according to one or more embodiments of the inventive method described above.

The data storage medium can be, for example, a DVD, a magnetic tape or a USB stick on which electronically readable control information is stored.

The present invention can use various reconstruction methods to create the MR image based on the MR data acquired according to the invention. Among these reconstruction methods are radial reconstruction methods, for example back-projection and regridding.

The present invention is particularly suitable for generation of MR images on which scars in the region of the heart can be shown. The contrast between tissues can be intensified by injecting gadolinium (a contrast agent). Naturally, however, the present invention is not limited to this preferred field of application since the present invention can, for example, also be used to create MR images that show other regions of the human body, or which even depict dead material.

BRIEF DESCRIPTION OF THE DRAWINGS

FIG. 10 is a flow chart of an embodiment of the method according to the invention.

DESCRIPTION OF THE PREFERRED EMBODIMENTS

Figure 1:
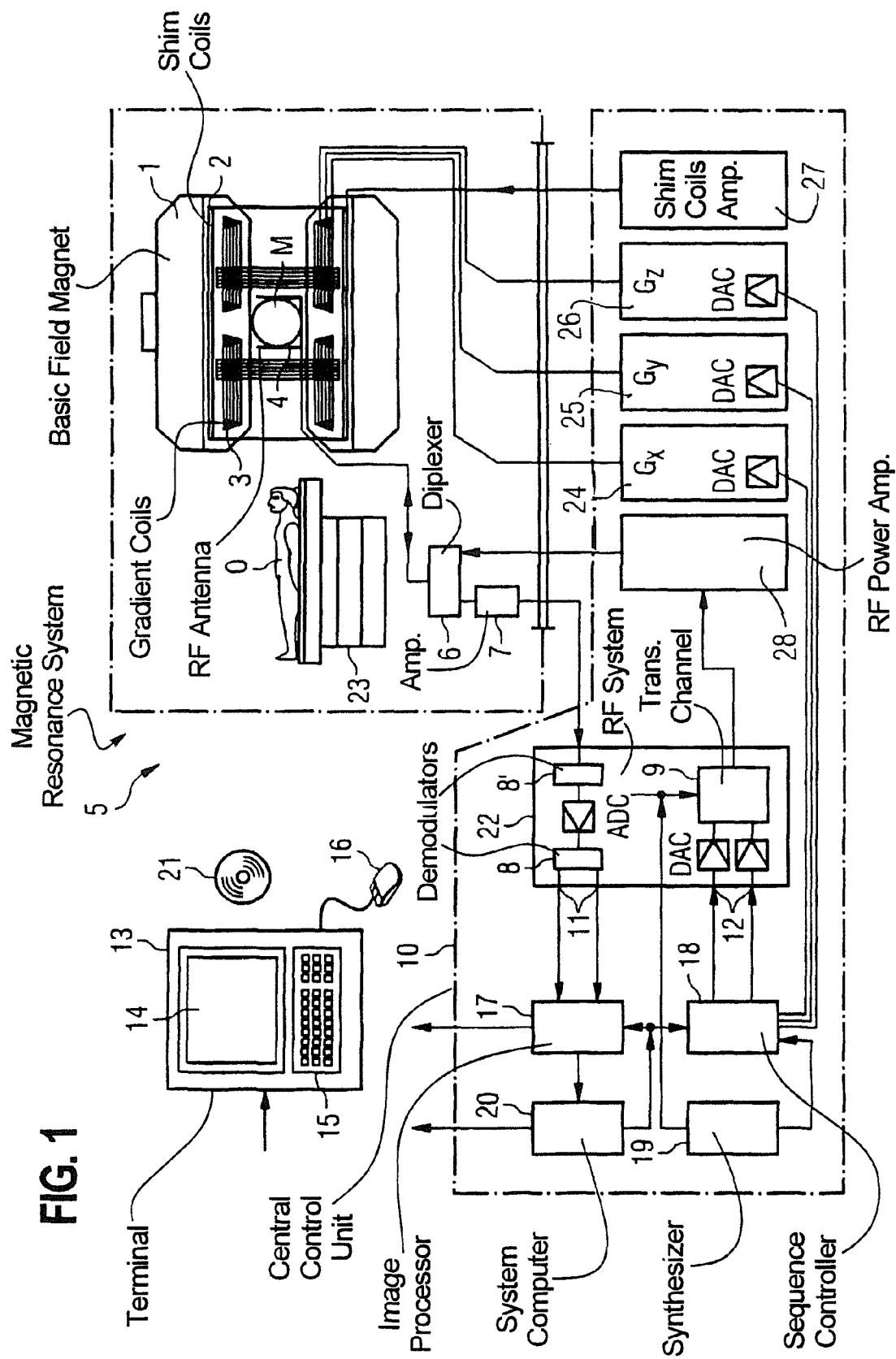
FIG. 1 shows a magnetic resonance system according to the invention.

FIG. 1 schematically illustrates a magnetic resonance system 5 (a magnetic resonance imaging or magnetic resonance tomography apparatus). A basic field magnet 1 generates a temporally constant, strong magnetic field for polarization or alignment of the nuclear spins in a volume segment of a subject O, for example a part of a human body that is to be examined, lying on a table 23 in the magnetic resonance system 5. The high homogeneity of the basic magnetic field that is required for the magnetic resonance measurement (data acquisition) is defined in a typically spherical measurement volume M in which the parts of the human body that are to be examined are arranged. To support the homogeneity requirements, and in particular to eliminate temporally invariant influences, shim plates made of ferromagnetic material are mounted at a suitable point. Temporally variable influences are eliminated by shim coils 2 operated by a shim coils amplifier 27.

A cylindrical gradient coil system 3, which has three sub-windings, is used in the basic magnetic field 1. Each sub-winding is supplied by an amplifier with current to generate a linear (also temporally variable) gradient field in the respective direction of the Cartesian coordinate system. The first sub-winding of the gradient field system 3 generates a gradient $G_x$ in the x-direction; the second sub-winding generates a gradient $G_y$ in the y-direction; and the third sub-winding generates a gradient $G_z$ in the z-direction. Each amplifier has a digital/analog converter controlled by a sequence controller 18 for accurately-timed generation of gradient pulses.

Located within the gradient field system 3 is one (or more) radio-frequency antenna(s) 4 that convert the radio-frequency pulses emitted by a radio-frequency power amplifier 28 into an alternating magnetic field to excite the nuclei and align the nuclear spins of the subject O to be examined, or of the region of the subject O that is to be examined. Each radio-frequency antenna 4 has one or more RF transmission coils and one or more RF reception coils in the form of an annular arrangement (advantageously linear or matrix-like) of component coils. The alternating field emanating from the precessing nuclear spins—i.e. normally nuclear spin echo signals caused by a pulse sequence made up of one or more radio-frequency pulses and one or more gradient pulses—is also transduced by the RF reception coils of the respective radio-frequency antenna 4 into a voltage (measurement signal), which is supplied via an amplifier 7 to a radio-frequency reception channel 8 of a radio-frequency system 22. The radio-frequency system 22 furthermore has a transmission channel 9 in which the radio-frequency pulses are generated for the excitation of the nuclear magnetic resonance. The respective radio-frequency pulses are represented digitally in the sequence controller 18 as a series of complex numbers based on a pulse sequence predetermined by the system computer 20. This number series is supplied as a real part and an imaginary part respective inputs 12 to a digital/analog converter in the radio-frequency system 22, and from this to a transmission channel 9. In the transmission channel 9 the pulse sequences are modulated on a radio-frequency carrier signal whose base frequency corresponds to the center frequency.

The switch-over from transmission operation to reception operation takes place via a transmission/reception diplexer 6. The RF transmission coils of the radio-frequency antenna(s) 4 radiate(s) the radio-frequency pulses into the measurement volume M to excite the nuclear spins and samples resulting echo signals via the RF reception coils. The correspondingly acquired nuclear magnetic resonance signals (also called echo signals) are phase-sensitively demodulated at an intermediate frequency in a reception channel 8' (first demodulator) of the radio-frequency system 22 and are digitized in the analog/digital converter (ADC). This signal is further demodulated to a frequency of zero. The demodulation to a frequency of zero and the separation into real part and imaginary part occur after the digitization in the digital domain in a second demodulator 8. An MR image or, respectively, three-dimensional image data set is reconstructed by an image computer 17 from the measurement data acquired in such a manner. The administration of the measurement data, the image data and the control programs takes place via the system computer 20. Based on a specification with control programs, the sequence controller 18 controls the generation of the respective desired pulse sequences and the corresponding scanning of k-space. In particular, the sequence controller 18 controls the accurately-timed switching of the gradients, the emission of the radio-frequency pulses with defined phase amplitude and the reception of the nuclear magnetic resonance signals. The time base for the radio-frequency system 22 and the sequence controller 18 is provided by a synthesizer 19. The selection of corresponding control programs to generate an MR image (which is stored on a DVD 21, for example) and the presentation of the generated MR image take place via a terminal 13 that has a keyboard 15, a mouse 16 and a monitor 14.

Six embodiments according to the invention of the method according to the invention are presented as examples with the use of FIGS. 2 through 7. In each of these FIGS. 2 through 7, the angle φ, which the respective k-space line has relative to a predetermined axis in k-space, is shown for the acquisition point in time of the corresponding k-space line. Strictly speaking, it is not an acquisition point in time since a certain time duration elapses for the acquisition of the MR data of the k-space points of the respective k-space line. However, since this time duration is small relative to the acquisition time T in which all k-space lines are to be acquired, the term "acquisition point in time" is nevertheless appropriate for use herein. Moreover, the k-space lines in the embodiments described in FIGS. 2 through 7 lie in a two-dimensional plane in k-space.

Figure 2:
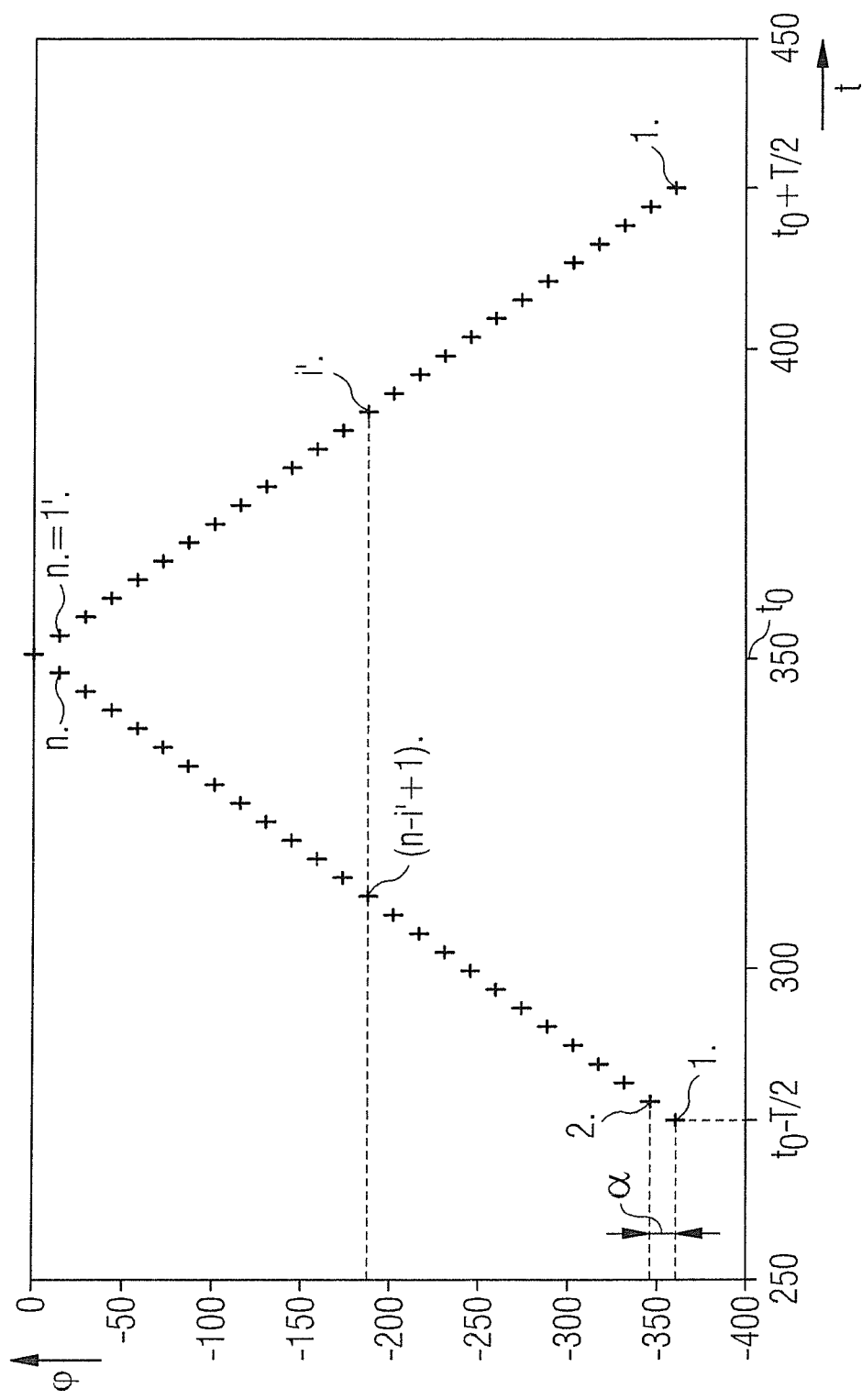
FIG. 2 shows the angle of a respective k-space line over time for a linear order, wherein each k-space line scanned after the point in time corresponds exactly to a k-space line scanned before the point in time.

An example of a first embodiment according to the invention is shown in FIG. 2. According to this first embodiment, within the predetermined time period T, n lines are scanned before the point in time t0 and n lines are scanned after the point in time t0. Lines to be scanned before the point in time t0 are thereby arranged such that k-space is scanned radially and uniformly. Two spatially adjacent k-space lines which are scanned before the point in time t0 thereby have the same angle interval α.

According to a predetermined order, the k-space lines are scanned before the point in time t0 such that the respective currently scanned k-space line has this angle interval α relative to its chronological predecessor k-space line. According to a different order, the k-space lines are scanned after the point in time t0 such that the respective currently scanned k-space line has the same angle interval α relative to its chronological predecessor k-space line. Each k-space line scanned after the point in time t0 thereby corresponds to a k-space line scanned before the point in time t0.

According to this first embodiment, the other order is identical to the reverse of the predetermined order, such that the i'-th k-space line according to the other order is identical to the (n−i+1)-th k-space line according to the predetermined order. The k-space lines according to the other order therefore also have the angle interval α. This means that, in the other order, it also applies that a k-space line scanned according to this other order has this angle interval α relative to its chronological predecessor k-space line.

In FIG. 2, the numerical indices without "'" correspond to the numerical indices of the predetermined order, and the numerical indices with "'" correspond to the numerical indices of the other order.

According to the first embodiment, the k-space line scanned at the point in time (t0−t) is identical to the k-space line scanned at the point in time (t0+t).

According to the invention, two variants exist for all embodiments described with the aid of FIGS. 2 through 7. In the first variant, a k-space line is scanned at the point in time t0, and in the other variant this is not the case. In the event that a k-space line is scanned at the point in time t0, this counts towards neither the k-space lines scanned before the point in time t0 nor towards the k-space lines scanned after the point in time t0.

Figure 3:
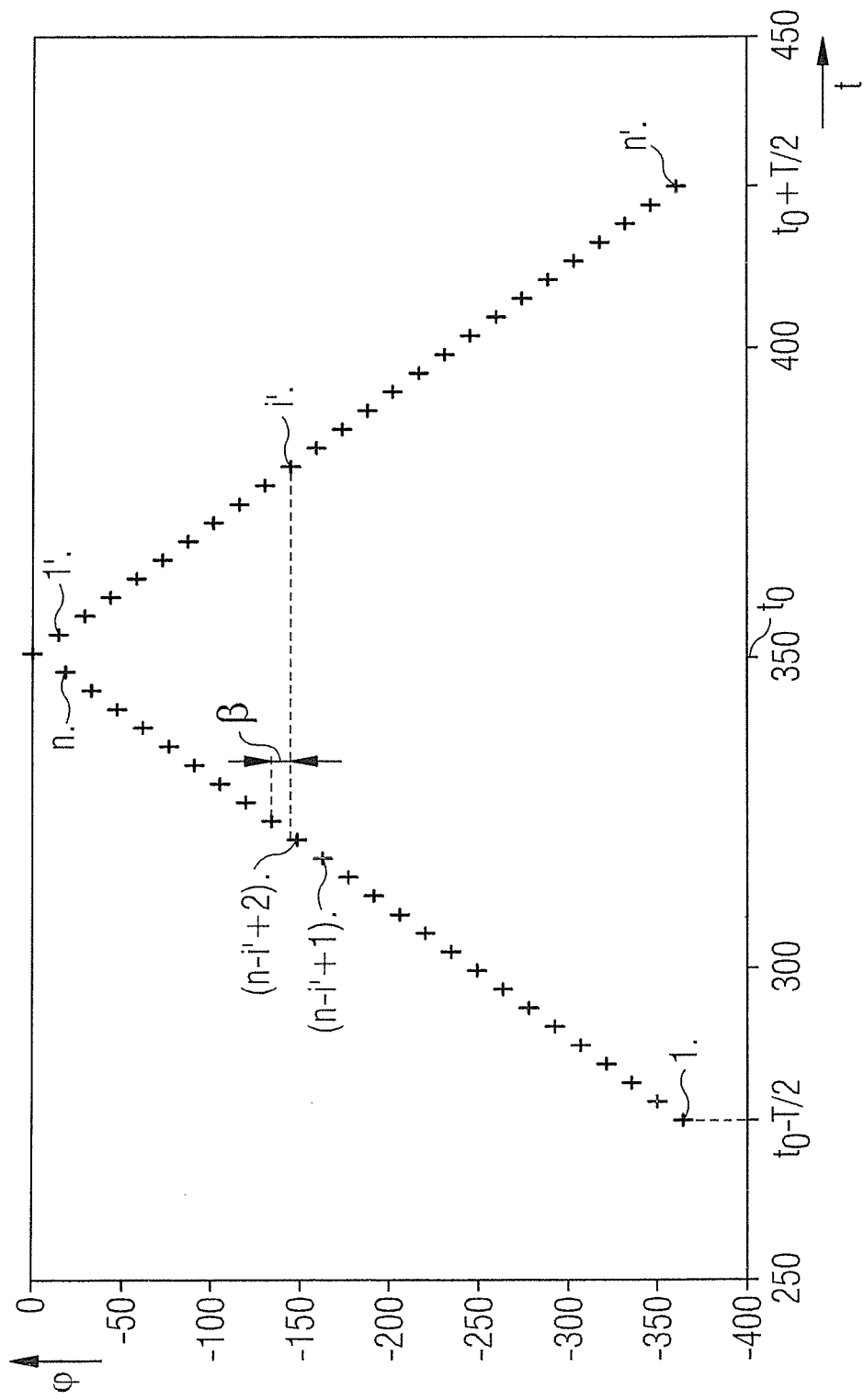
FIG. 3 shows the angle of a respective k-space line over time for a linear order, wherein each k-space line scanned after the point in time lies in the middle between two k-space lines scanned before the point in time.

A second embodiment according to the invention is presented as an example with the aid of FIG. 3.

This second embodiment is similar to the first embodiment. In particular, the n k-space lines that are scanned before the point in time t0 in the second embodiment correspond to the k-space lines of the first embodiment that are scanned before the point in time t0. In other words: the second embodiment differs from the first embodiment only with regard to those k-space lines that are scanned after the point in time t0.

In this second embodiment, the k-space lines scanned after the point in time t0 do not corresponding to any of the k-space lines scanned before the point in time t0; rather, instead of this ever line scanned after the point in time t0 essentially lies between two k-space lines that are scanned before the point in time t0. Expressed differently: every k-space line that is scanned after the point in time t0 is shifted by the same (constant) angle interval β relative to the corresponding k-space line of the first embodiment. This angle interval β corresponds to half of that angle interval α by which two spatially adjacent k-space lines of the predetermined or other order are separated.

In the example shown in FIG. 3, the angle φ which every k-space line has relative to the predetermined axis within k-space is reduced by the angle interval 13 in the k-space lines scanned after the point in time t0 in comparison to the first embodiment. Since—in the embodiment shown in FIG. 3—a k-space line is scanned at the point in time t0, the first k-space line (with the index 1') scanned after the point in time t0 therefore is spatially situated between the k-space line scanned at the point in time t0 and the last k-space line (with the index n) scanned before the point in time t0. The second k-space line scanned after the point in time t0 therefore is spatially situated between the penultimate k-space line and the last k-space line scanned before the point in time t0. For the general case it is valid that the i'-th line according to the other order lies between the (n−i'+1)-th line and the (n−i'+2)-th line according to the predetermined order.

In comparison to the first embodiment, the second embodiment has a coverage of k-space that is improved by a factor of 2.

Figure 4:
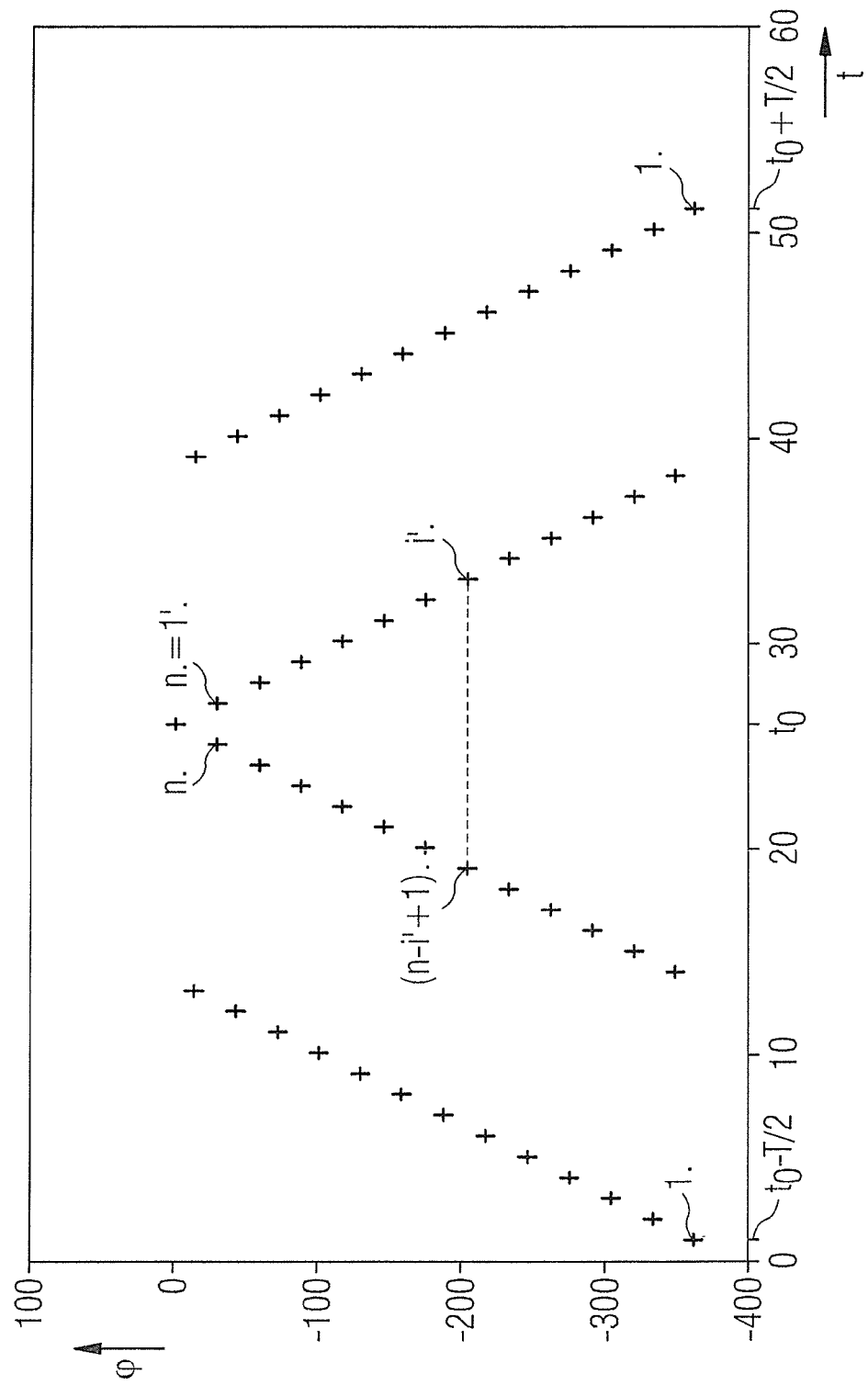
FIG. 4 shows the angle of a respective k-space line over time for an interleaved order, wherein each k-space line scanned after the point in time corresponds exactly to a k-space line scanned before the point in time.

An example of a third embodiment according to the invention is shown in FIG. 4.

In comparison to the first embodiment, this third embodiment only has the difference that the k-space lines are acquired interleaved both before and after the point in time t0. This means that the n k-space lines that are acquired before or after the point in time t0 are subdivided into multiple segments. In contrast to this, in the third embodiment these same k-space lines are acquired as in the first embodiment; only the chronological orders (i.e. the predetermined order and the other order) have changed. If s corresponds to the number of segments before or, respectively, after the point in time t0, and if n is divisible by s, then n/s k-space lines are scanned per segment. The angle interval between two chronologically successively scanned k-space lines in the same segment corresponds to s*α. The order in which the k-space lines in the j-th segment (1≤j≤s) are scanned before the point in time t0 is as follows: j, j+s, j+2*s, ..., n−(s−j) when the indices are used according to the order of the first embodiment or according to the order in which the k-space lines are sorted based on their angle φ relative to the predetermined axis.

As in the first embodiment, in the third embodiment the other order corresponds to the reverse of the predetermined order. Expressed in a different way, the i'-th k-space line according to the other order corresponds to the (n−i'+1)-th k-space line according to the predetermined order, or the k-space line scanned at the point in time (t0−t) corresponds to the k-space line scanned at the point in time (t0+t).

Figure 5:
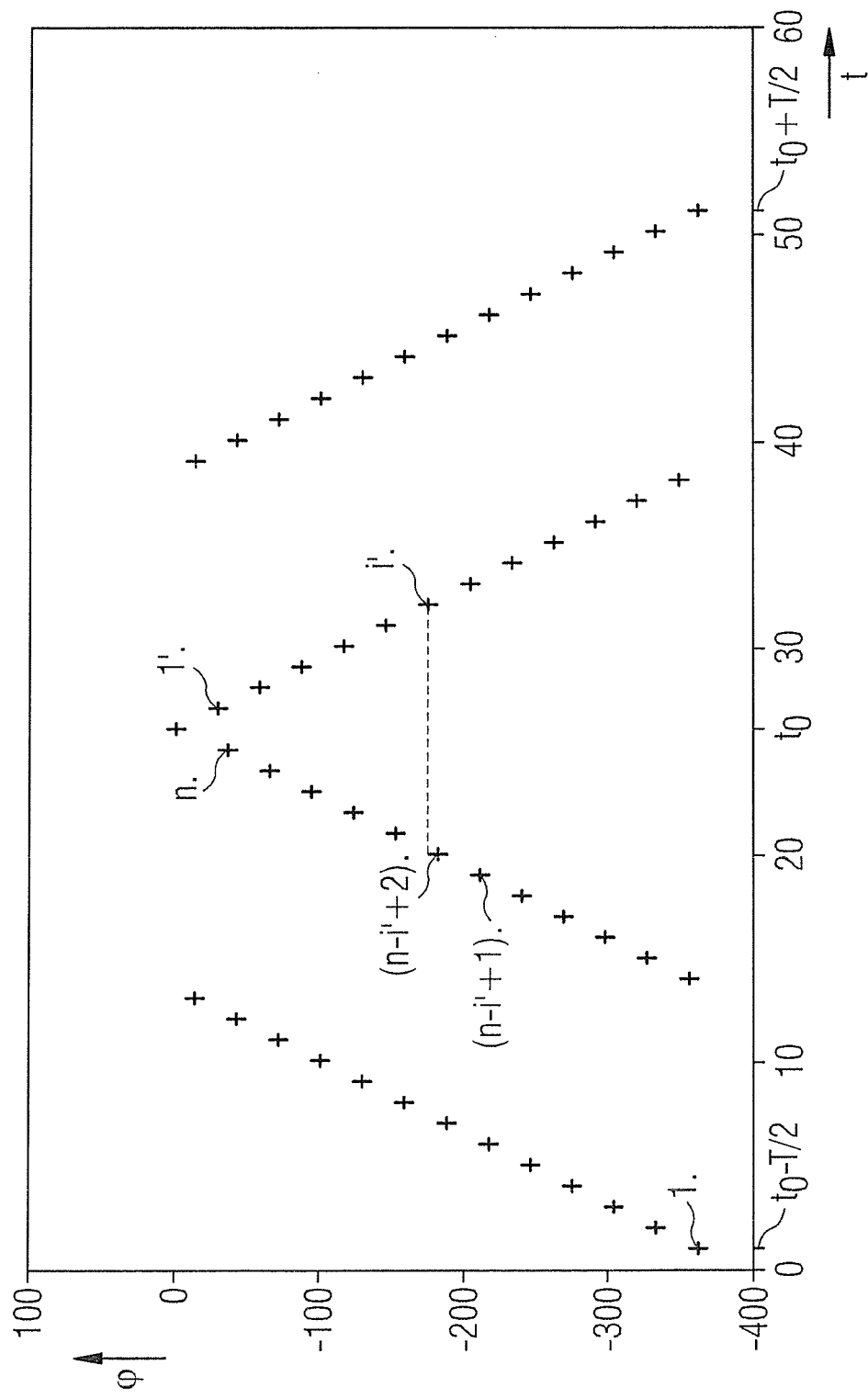
FIG. 5 shows the angle of a respective k-space line over time for an interleaved order, wherein each k-space line scanned after the point in time lies in the middle between two k-space lines scanned before the point in time.

The fourth embodiment according to the invention which is presented as an example in FIG. 5 is a variant of the third embodiment. The difference between the fourth and third embodiment is the same as the difference between the second and first embodiment.

As in the second embodiment, in the fourth embodiment every k-space line (except for the first or the last) scanned after the point in time t0 is spatially situated in the middle between two k-space lines which are scanned before the point in time t0. This means that every k-space line scanned after the point in time t0 is shifted by the same (constant) angle interval β relative to the corresponding k-space line of the third embodiment. As in the second embodiment, this angle interval β corresponds to half of the angle interval α.

In the example shown in FIG. 5, the angle φ that each k-space line has relative to the predetermined axis at the k-space line scanned after the point in time t0 is reduced by the angle interval β in comparison to the third embodiment. The first k-space line (with the index 1') scanned after the point in time t0 therefore is spatially situated between the last k-space line (with the index n) scanned before the point in time t0 and the k-space line scanned at the point in time t0. In contrast to FIG. 3, however, the i'-th k-space line in FIG. 5 is not situated in the middle between the n-th k-space line and the k-space line scanned at the point in time t0; rather, it is situated markedly closer to the n-th k-space line since, due to the two segments (s=2), the angle interval between two chronologically successively acquired k-space lines within the same segment 2*α, and therefore corresponds to four times the angle interval β.

Figure 6:
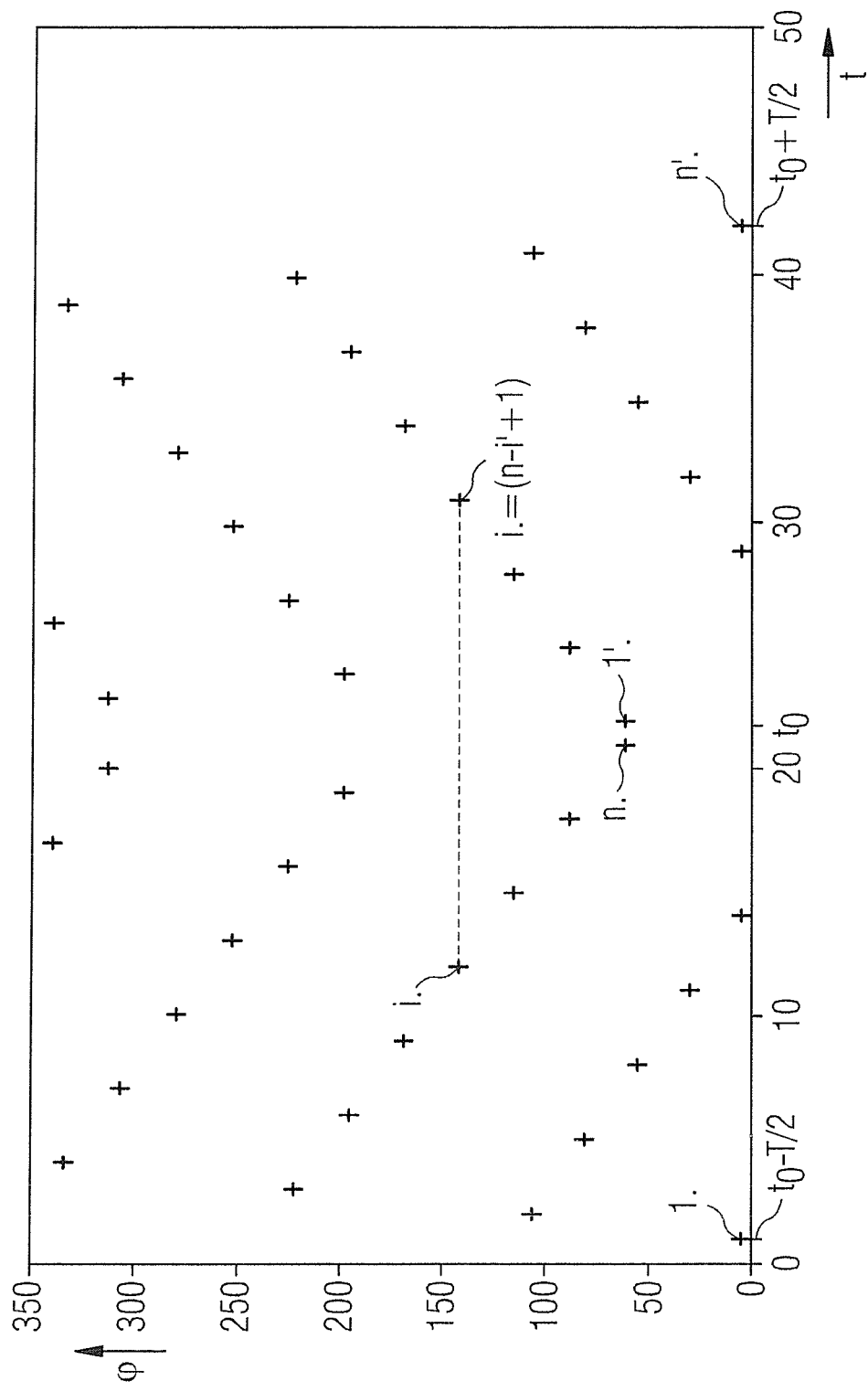
FIG. 6 shows the angle of a respective k-space line over time for an order determined by means of the golden angle, wherein each k-space line scanned after the point in time corresponds exactly to a k-space line scanned before the point in time.
Figure 7:
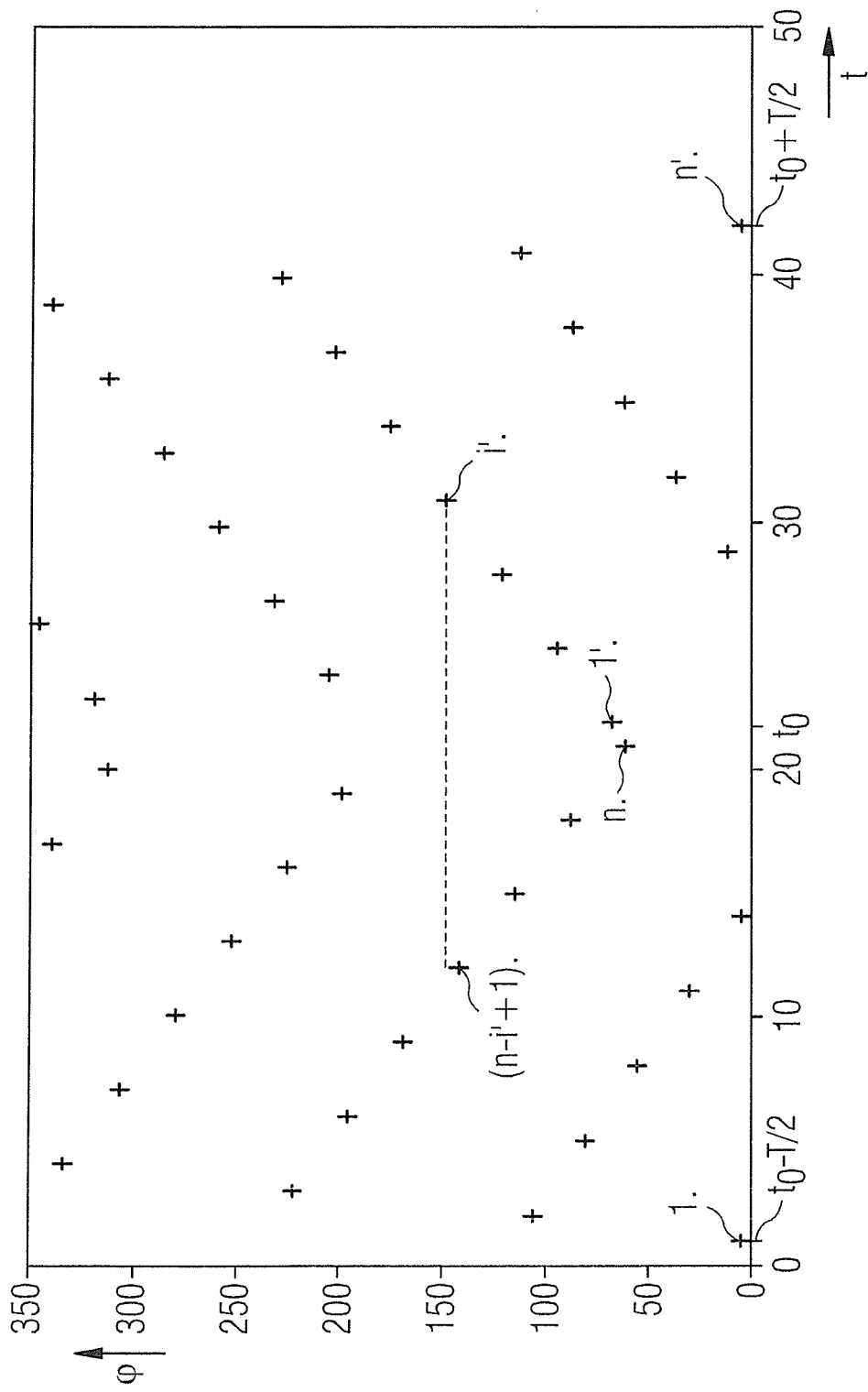
FIG. 7 shows the angle of a respective k-space line over time for an order determined by means of the golden angle, wherein each k-space line scanned after the point in time lies in the middle between two k-space lines scanned before the point in time.

In FIGS. 6 and 7, examples of a fifth embodiment and a sixth embodiment according to the invention are shown, in which the respective angles φ which lie between the respective k-space line of the predetermined axis are determined with the aid of the golden angle ψ. The golden angle ψ can thereby be either the small golden angle $\psi_1$ according to the following Equation (3) or the large golden angle $\psi_2$ according to Equation (4). It is also possible to use half of the large golden angle $\psi_2$ instead of the small or large golden angle.

$$\Psi_1 = 360° - \frac{720°}{1+\sqrt{5}} \approx 137.5° \quad (3)$$

$$\Psi_2 = \frac{720°}{1+\sqrt{5}} \approx 222.5° \quad (4)$$

In the fifth embodiment, according to the predetermined order, the angle interval between the i-th k-space line and the (i+1)-the line corresponds to the golden angle ψ. In other words, two k-space lines acquired in chronological succession have the golden angle ψ as the angle interval before the point in time.

As in the first and third embodiments, the "other order" is the reverse of the predetermined order, such that—according to the fifth embodiment—the same k-space lines are scanned after the point in time t0 as before the point in time. In the k-space lines acquired after the point in time t0, two k-space lines scanned in chronological succession therefore also have the golden angle ψ as an angle interval.

In the sixth embodiment, the k-space lines acquired before the point in time do not differ from the k-space lines of the fifth embodiment that are acquired before the point in time t0. However, the k-space lines acquired after the point in time t0 in the sixth embodiment are respectively rotated by an angle δ around the k-space center relative to the corresponding k-space line after the point in time t0 according to the fifth embodiment, the angle δ being calculated as:

$$\delta = \frac{360°}{4*n} \quad (5)$$

In this sixth embodiment, each k-space line which is acquired after the point in time t0 (with the exception of the first or, respectively, last) is accordingly situated centrally between two k-space lines acquired before the point in time t0, wherein the angle interval of the respective k-space line acquired after the point in time t0 corresponds to the angle δ relative to both adjacent k-space lines acquired before the point in time t0.

Two variants thereby exist. All k-space lines which are acquired after the point in time are rotated either clockwise by the angle δ or counterclockwise by the angle δ in comparison to the k-space lines of the fifth embodiment that are acquired after the point in time.

Figure 8:
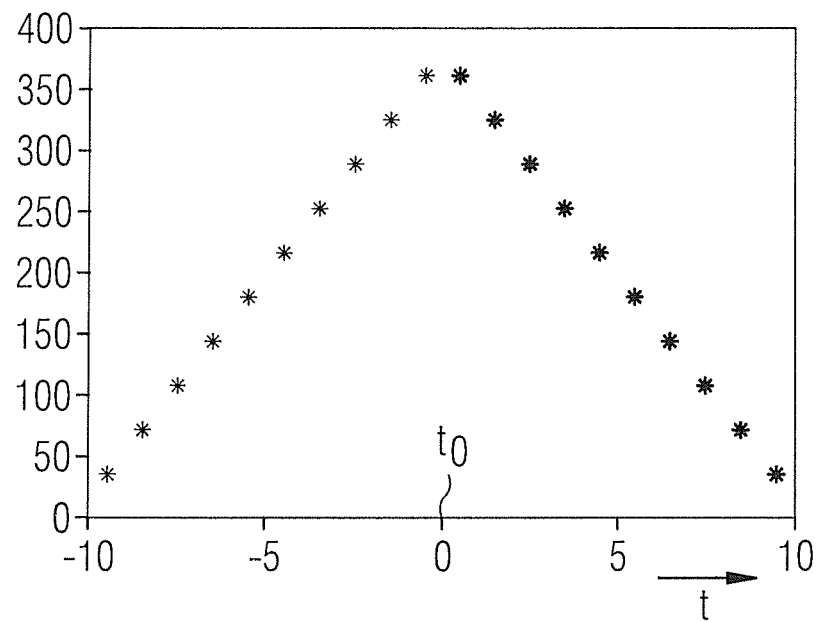
FIGS. 8 and 9 schematically illustrate an embodiment of the invention with segmented MR data acquisition.
Figure 9:
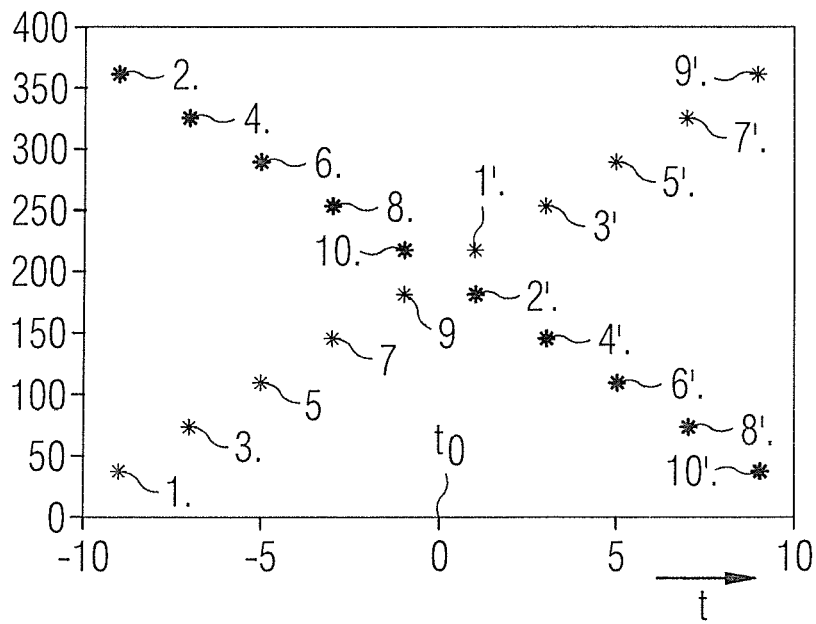

An embodiment according to the invention in which the k-space lines are scanned per segment is explained with FIGS. 8 and 9. For this, the unsegmented acquisition of k-space lines is shown in FIG. 8, wherein the relationship of the angle φ of the respective k-space line to the scan point in time of the respective k-space line (which relationship is shown in FIG. 8) corresponds in principle to the first embodiment which is shown in FIG. 2.

In the segmented acquisition of the k-space lines that is shown in FIG. 9, the k-space lines that are acquired in the unsegmented acquisition (FIG. 8) before the predetermined point in time t0 are scanned in a first segment, while the k-space lines that are acquired after the predetermined point in time t0 are scanned in the unsegmented acquisition (FIG. 8) in a second segment. The time period T in which all 20 k-space lines are scanned in the unsegmented case is identical to that time period T in which the k-space lines of the first segment or the second segment are scanned. In other words: in the segmented acquisition the time interval between two chronologically successive k-space lines is doubled in comparison to the unsegmented acquisition.

The k-space lines before the predetermined point in time t0 thus can be brought into a predetermined order according to their acquisition points in time, and the k-space lines after the predetermined point in time t0 can thereby be brought into a different order according to their acquisition points in time, such that the i-th line after the point in time t0 according to the different order is situated adjacent with regard to the (n−1+1)-th line according to the predetermined order, as is shown in FIG. 9.

The temporal symmetry of k-space lines according to the invention is also maintained in the segmented acquisition. This means that the two k-space lines which are adjacent according to the definition according to the invention and therefore form a pair have scan points in time which have the same time interval from the predetermined point in time to.

An example of a workflow of the method according to the invention is shown in FIG. 10.

The k-space lines to be acquired are determined in a first Step S1 and brought into a predetermined order in which they should be scanned in chronological succession.

An RF preparation pulse is radiated in a second Step S2.

In the following Step S3, the k-space lines are acquired in the order determined in Step S1 before a predetermined point in time t0.

The same k-space lines are subsequently acquired in a different order which corresponds to the reverse of the predetermined order, after the predetermined point in time to.

Since an MR data acquisition has occurred twice for each k-space line, in Step S5 the MR data acquired for the respective k-space line before the point in time and after the point in time are averaged.

Depending on these averaged MR data, the MR image is created in Step S6. To create the MR image, iterative reconstruction methods can be used in which one model value is associated per iteration with each pixel of the MR image to be created. These model values are transformed again into k-space via a Fourier transformation, whereby differences relative to the MR data measured in k-space can be determined and reduced in the next iteration. An example of such an iterative reconstruction method is described in the graduate thesis "Modellbasierte Rekonstruktion unterabgetasteter radialer Daten am Beispiel der Herzperfusion" ["Model-based reconstruction of undersampled radial data in the example of cardiac perfusion"], by J. Tran-Gia at the University of Würzburg, 2010.

Since the effects to be corrected via the iterative reconstruction method are comparably small due to the acquisition of MR data according to the invention, a few iterations are sufficient to reconstruct the MR image. Since the iterative reconstruction method can comparably quickly reconstruct an MR image from the MR data, the method according to the invention is also usable in everyday clinical settings.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to generate a magnetic resonance (MR) image comprising:
   operating an MR data acquisition unit, in which an examination subject is placed, to radiate an excitation radio-frequency (RF) pulse into the subject to excite nuclear spins in the subject;
   operating said MR data acquisition unit to radiate additional RF pulses, and at least one magnetic gradient field, in order to detect MR data, resulting from the excited nuclear spins within a predetermined time period;
   entering the acquired MR data into an electronic memory representing k-space along multiple uniform trajectories in k-space, so as to acquire data in each of said trajectories;
   acquiring said trajectories chronologically in a predetermined order before a predetermined point in time within said time period;
   acquiring said trajectories chronologically in a different order, that differs from said predetermined order, after said point in time in order to cause an i-th trajectory after said point in time in said different order to be adjacent to an (n−i+1)-th trajectory in said predetermined order, wherein n is a number of said trajectories acquired before said point in time and after said point in time, with two of said trajectories being adjacent when a distance between the two trajectories is less than a predetermined threshold;
   acquiring said trajectories to cause none of said trajectories, except for said (n−i+1)-th trajectory, acquired before said point in time has a distance from said i-th trajectory that is less than said threshold;
   setting said predetermined time period to be within a time duration after radiating said RF excitation pulse so as to cause a contrast change within said predetermined time period to proceed substantially linearly with respect to time;
   setting said point in time to be in a middle of said time period; and
   in a processor, accessing k-space in said memory and generating a magnetic resonance image representing said examination subject from the acquired trajectories in k-space, and making data representing said image available as a data file at an output of said processor.

2. A method as claimed in claim 1 comprising:
   acquiring a first of two trajectories that are adjacent at a first point in time, acquiring a second of two trajectories that are adjacent at a second point in time, said second point in time differing from said first point in time; and
   setting said first point in time and said second point in time relative to said predetermined point in time to cause a first difference between said first point in time and said predetermined point in time to equal a second difference between said second point in time and said predetermined point in time.

3. A method as claimed in claim 1 comprising defining said trajectories in k-space to cause a difference between two successive trajectories to be an angle interval by which one of said two trajectories is rotated around a center of k-space relative to the other of said two trajectories.

4. A method as claimed in claim 3 wherein said angle interval is beta, and satisfies:

$$\beta \leq \frac{360°}{2*n}.$$

5. A method as claimed in claim 3 wherein said trajectories are all in one plane, and comprising defining an angle by which a (i+1)-th trajectory in said predetermined order is rotated around the center of k-space relative to the i-th trajectory in said predetermined order, and determining said predetermined order using said angle to cause each respective trajectory to be rotated by said angle relative to the immediate predecessor of the respective trajectory.

6. A method as claimed in claim 5 wherein said angle is alpha, and satisfies:

$$\alpha \geq 2*\beta.$$

7. A method as claimed in claim 5 comprising acquiring said trajectories in a number of segments, said number of segments being even, and in a second half of said segments, acquiring said trajectories before said point in time without segmentation and, in a second half of said segments, acquiring said trajectories after said predetermined point in time without segmentation, and defining a rotation direction by which a respective acquired trajectory is rotated by said angle around the center of k-space in order to generate a trajectory acquired immediately following the respective trajectory, and maintaining a same rotation direction through said angle during acquisition of the trajectories in one of said segments.

8. A method as claimed in claim 1 comprising causing an end point of each trajectory to coincide with a center of k-space.

9. A method as claimed in claim 1 comprising acquiring trajectories after said point in time by rotating the respective trajectories by 180° around a center of k-space before acquiring the respective trajectory.

10. A method as claimed in claim 1 comprising setting said different order to be the reverse of said predetermined order, to cause same trajectories to be acquired after said point in time as before said point in time with a first trajectory acquired after said point in time corresponding to a last trajectory acquired before said point in time.

11. A method as claimed in claim 1 comprising defining each trajectory so as to proceed in a straight line in k-space.

12. A method as claimed in claim 1 comprising generating said MR image by calculating an average value of the MR data in respective pairs of said adjacent trajectories.

13. A method as claimed in claim 1 wherein each trajectory acquired after said predetermined point in time has a same first distance from a trajectory adjacent thereto acquired before said predetermined point in time, and wherein two lines situated spatially next to each other in k-space that are acquired before said predetermined point in time respectively have a same second distance, with said first distance corresponding to one half of said same second distance.

14. A magnetic resonance (MR) apparatus, comprising:
an MR data acquisition unit;
a control unit configured to operating said MR data acquisition unit, in which an examination subject is placed, to radiate an excitation radio-frequency (RF) pulse into the subject to excite nuclear spins in the subject;
said control unit being configured to operate said MR data acquisition unit to radiate additional RF pulses, and at least one magnetic gradient field, in order to detect MR data, resulting from the excited nuclear spins within a predetermined time period;
an electronic memory that represents k-space;
said control unit being configured to enter the acquired MR data into said electronic memory that represents k-space along multiple uniform trajectories in k-space, so as to acquire data in each of said trajectories;
said control unit being configured to acquire said trajectories chronologically in a predetermined order before a predetermined point in time within said time period;
said control unit being configured to acquire said trajectories chronologically in a different order, that differs from said predetermined order, after said point in time in order to cause an i-th trajectory after said point in time in said different order to be adjacent to an (n−i+1)-th trajectory in said predetermined order, wherein n is a number of said trajectories acquired before said point in time and after said point in time, with two of said trajectories being adjacent when a distance between the two trajectories is less than a predetermined threshold;
said control unit being configured to acquire said trajectories to cause none of said trajectories, except for said (n−i+1)-th trajectory, acquired before said point in time has a distance from said i-th trajectory that is less than said threshold;
said control unit being configured to set said predetermined time period to be within a time duration after radiating said RF excitation pulse so as to cause a contrast change within said predetermined time period to proceed substantially linearly with respect to time;
said control unit being configured to set said point in time to be in a middle of said time period; and
a processor configured to access k-space in said electronic memory and to generate a magnetic resonance image representing said examination subject from the acquired trajectories in k-space, and to make data representing said image available as a data file at an output of said processor.

15. A non-transitory, computer-readable data storage medium encoded with programming instructions, said data storage medium being loaded into a computerized control and evaluation system of a magnetic resonance (MR) apparatus, said MR apparatus including an MR data acquisition unit, and said programming instructions causing said computerized control and evaluation system to:
operate said MR data acquisition unit, in which an examination subject is placed, to radiate an excitation radio-frequency (RF) pulse into the subject to excite nuclear spins in the subject;
operate said MR data acquisition unit to radiate additional RF pulses, and at least one magnetic gradient field, in order to detect MR data, resulting from the excited nuclear spins within a predetermined time period;
enter the acquired MR data into an electronic memory representing k-space along multiple uniform trajectories in k-space, so as to acquire data in each of said trajectories;
acquire said trajectories chronologically in a predetermined order before a predetermined point in time within said time period;
acquire said trajectories chronologically in a different order, that differs from said predetermined order, after said point in time in order to cause an i-th trajectory after said point in time in said different order to be adjacent to an (n−i+1)-th trajectory in said predetermined order, wherein n is a number of said trajectories acquired before said point in time and after said point in time, with two of said trajectories being adjacent when a distance between the two trajectories is less than a predetermined threshold;
acquire said trajectories to cause none of said trajectories, except for said (n−i+1)-th trajectory, acquired before said point in time has a distance from said i-th trajectory that is less than said threshold;
set said predetermined time period to be within a time duration after radiating said RF excitation pulse so as to cause a contrast change within said predetermined time period to proceed substantially linearly with respect to time;
set said point in time to be in a middle of said time period; and
generate a magnetic resonance image representing said examination subject from the acquired trajectories in k-space, and make data representing said image available as a data file at an output of said processor.

* * * * *